(12) United States Patent
Pao et al.

(10) Patent No.: US 9,786,535 B2
(45) Date of Patent: Oct. 10, 2017

(54) WAFER TRANSPORT SYSTEM AND METHOD FOR OPERATING THE SAME

(71) Applicant: GUDENG PRECISION INDUSTRIAL CO., LTD., New Taipei (TW)

(72) Inventors: Hui-Ming Pao, New Taipei (TW); Cheng-Hsin Chen, New Taipei (TW); Po-Ting Lee, New Taipei (TW); Ming-Chien Chiu, New Taipei (TW); Tien-Jui Lin, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 416 days.

(21) Appl. No.: 14/556,233

(22) Filed: Nov. 30, 2014

(65) Prior Publication Data
US 2015/0340260 A1    Nov. 26, 2015

(30) Foreign Application Priority Data
May 23, 2014 (TW) .............................. 103118104 A

(51) Int. Cl.
| | |
|---|---|
| B08B 3/00 | (2006.01) |
| H01L 21/677 | (2006.01) |
| H01L 21/673 | (2006.01) |
| H01L 21/68 | (2006.01) |
| H01L 21/687 | (2006.01) |
| H01L 21/67 | (2006.01) |

(52) U.S. Cl.
CPC .... *H01L 21/67748* (2013.01); *H01L 21/6773* (2013.01); *H01L 21/67259* (2013.01); *H01L 21/67353* (2013.01); *H01L 21/67393* (2013.01); *H01L 21/67736* (2013.01); *H01L 21/67778* (2013.01); *H01L 21/68* (2013.01); *H01L 21/687* (2013.01)

(58) Field of Classification Search
None
See application file for complete search history.

(56) References Cited

U.S. PATENT DOCUMENTS

| | | | | |
|---|---|---|---|---|
| 5,388,945 A | * | 2/1995 | Garric | ................. G03F 7/70541 414/217.1 |
| 2003/0010643 A1 | * | 1/2003 | Gramarossa | ........ H01L 21/2885 205/137 |

* cited by examiner

*Primary Examiner* — Eric Golightly
(74) *Attorney, Agent, or Firm* — Cheng-Ju Chiang

(57) ABSTRACT

The present invention relates to a wafer transport system and a method of operating the same. The wafer transport system comprises at least one semiconductor apparatus, a track, a transfer device, a positioning device, a carrier and a cleaning device. The wafer transport system transports wafers along the at least one semiconductor apparatus via the carrier riding on the track. The transfer device transfers the wafers from the carrier to the at least one semiconductor apparatus. The positioning device identifies and controls the position of the carrier on the track. The cleaning device maintains the cleanliness of the wafers. The present invention provides advantages for improving the yield rate of a wafer, shortening the fabrication time of a wafer, and offering the flexibility and the extendibility to a wafer transport system.

14 Claims, 8 Drawing Sheets

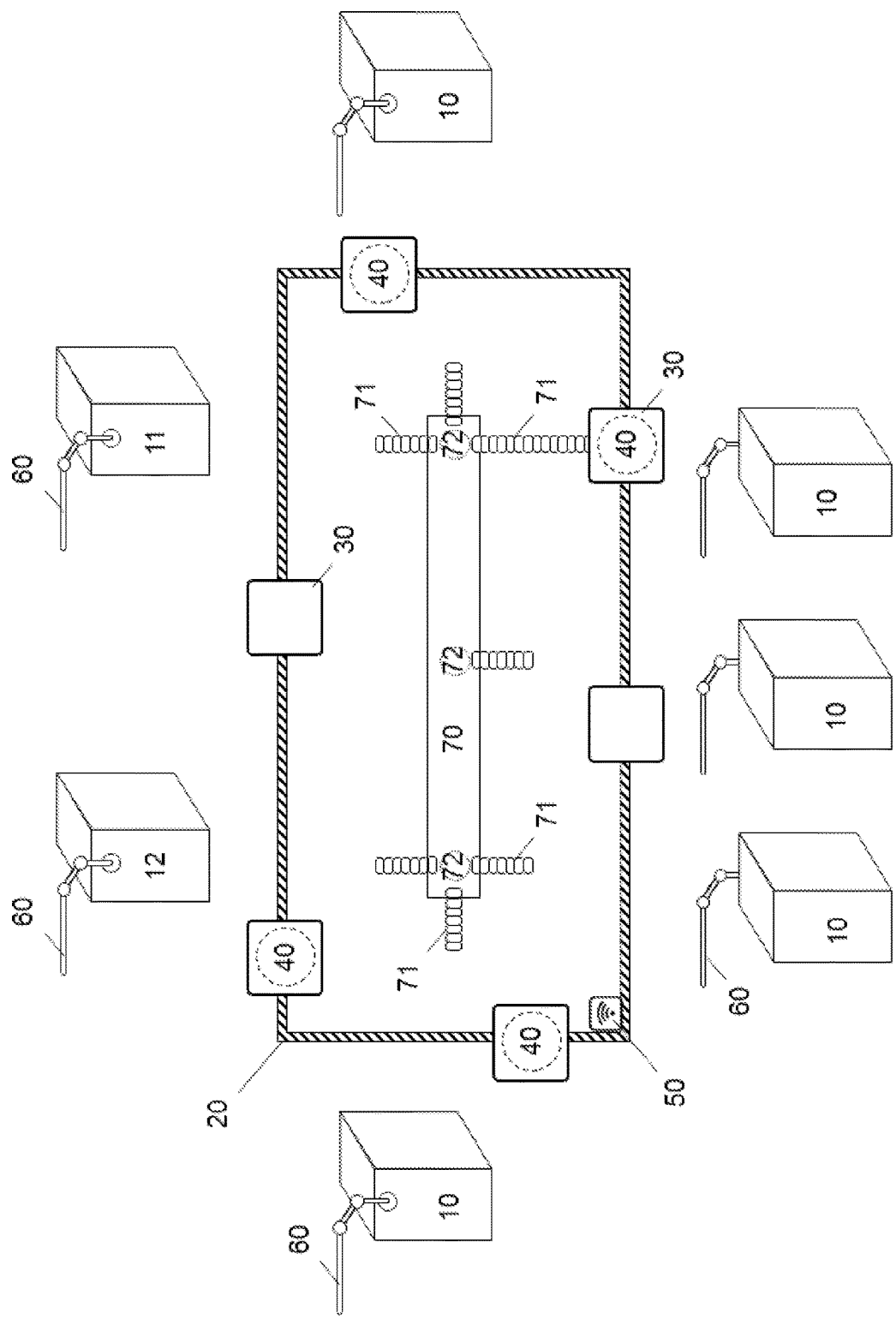

WAFER TRANSPORT SYSTEM AND METHOD FOR OPERATING THE SAME

BACKGROUND OF THE INVENTION

1. Technical Field

The present invention relates to a wafer transport system and a method for operating the same. More particularly, the present invention relates to a wafer transport system with a low-capacity carrier and a method for operating the same.

2. Description of the Related Art

Recently, the applications of wafers have greatly expanded from conventional electronic industry to the other fields, such as the solar industry. Therefore, the requirement of wafers and silicon thin-films has been greatly increased in the past few years.

The conventional manufacture of wafers is composed of several production processes and fabrication tools. For example, the production processes may comprise photolithography, measuring, etching, ion implantation, and deposition; and, the production process may be completed with the cooperation of multiple fabrication tools and measurement instruments. For harmonizing these production processes and fabrication tools to increase the productive efficiency, semiconductor foundries usually integrated the automated material handling system (AMHS) into the production process to control the movement, distribution and storage of materials.

The conventional AMHS equipment include overhead hoist transfer (OHT), rail guided vehicle (RGV), overhead shuttle (OHS), automated guided vehicle (AGV), and person rail guided vehicle (PRV). The AMHS equipment usually collocates with front opening unified pods (FOUP) capable of performing batch transfer of wafers among the workstations in a fabrication plant (FAB). In some situations, such batch transfer may be accomplished artificially by a worker who transports a fully loaded FOUP from one workstation to another for further processes.

Conventional FOUPs may, based on the design, accommodate wafers or substrates in a diameter of 300 mm (12-inch) or 450 mm (18-inch). The most common FOUPs are available with a capacity of 25 wafers. The AMHS would transfer a FOUP loaded with 25 semi-processed wafers from a first workstation to a second workstation for the following procedures, and request another FOUP full of untreated wafers to enter the first workstation to initiate another production cycle. For the wafers in a FOUP, the fabrication time of one production processes comprises the time for transporting in, the time for processing all the 25 wafers, and the time for transporting out.

Several problems have emerged from conventional AMHS and known transport systems in a sub-20 nm process of the semiconductor industry. The wafers become highly sensitive to several factors in such advanced production processes where the factors are required to be precisely controlled. The problems are as follows: (1) The patterns and the active regions on a wafer are damaged and inactivated easily when expose to oxygen or moisture. (2) The patterns on wafers with increasing diameter require multiple steps of photolithography which result in a long fabrication time. Additionally, the first processed wafer in a FOUP cannot continue to the following steps unless the other 24 wafers have undergone the same procedures; therefore, the fabrication time is further elongated. (3) Invisible micro cracks are easily formed on the patterns due to collisions. Especially when large-sized wafers are stacked in a wafer pod, a lot of wafers may be crushed due to the heavy weight. (4) For protecting the wafers from environmental contaminants and atmospheric gases, the entire system constructed in a clean room is supposed to be shut down for an engineer to enter to replace or repair the apparatus in the system.

Accordingly, there is a need for a novel wafer transport system to overcome the aforementioned defects.

SUMMARY

At least one embodiment in accordance with the present invention relates to a wafer transport system and a method for operating the same. More particularly, at least one embodiment relates to a wafer transport system with a low-capacity carrier and a method for operating the same. An objective of the present invention is to improve the yield rate of the wafers. Another objective of the present invention is to shorten the fabrication time of a wafer. Still another objective of the present invention is to offer flexibility and extendibility to a wafer transport system.

Some embodiments of the present invention relates to a wafer transport system comprising a semiconductor apparatus, a track, a carrier, a positioning device, a transfer device, and a cleaning device. The track is located along the semiconductor apparatus. The carrier is riding on the track and is for housing and transporting the wafer along the track. The positioning device is connected to the track for identifying and controlling the position of the carrier. The transfer device located between the semiconductor apparatus and the track is configured for transferring the wafer between the semiconductor apparatus and the track. The cleaning device may comprise a pipe and a pump. The pipe connects the pump to a first air valve of the carrier to clean the internal environment of the carrier.

In some aspects of the aforementioned embodiments, the wafer transport system is constituted by multiple small, isolated environments, and the wafers are delivered from one isolated environment to another isolated environment during transport. Therefore, even in a situation that the wafer transport system is built outside a clean room, wafers in the wafer transport system are still protected from exposing to the environmental contaminants. For example, a wafer may be transferred between a carrier and a semiconductor apparatus which each is with a clean and isolated environment.

In some cases, the wafer may be temporarily exposed to the environmental contaminants and atmospheric gases when it is transferring between the aforementioned carrier and the semiconductor apparatus. Accordingly, a nozzle may be configured on the transfer device for purging the wafer with clean gas which forms a protective layer on surfaces of the wafer. In some other cases, there is a risk that the carrier opened for receiving the wafer from the semiconductor apparatus may be temporarily exposed to the environmental contaminants. Accordingly, a pipe of the cleaning device may immediately connect to the carrier for cleaning the internal environment of the carrier.

Some embodiments of the present invention relates to a wafer transport system comprising at least one semiconductor apparatus, an entry port, an exit port, a track, a carrier, at least one positioning device, at least three transfer devices, and a cleaning device. The track is located along the at least one semiconductor apparatus, the entry port, and the exit port. The carrier is riding on the track and is for housing and transporting the wafer along the track. The positioning device is connected to the track for identifying and controlling the position of the carrier. The at least three transfer devices are located between the at least one semiconductor apparatus and the track, the entry port and the track, and the exit port and the track respectively. The at least three transfer devices are configured for transferring the wafer between the at least one semiconductor apparatus, the entry port, and the exit port. The cleaning device may comprise a pipe and a pump. The pipe connects the pump to a first air valve of the carrier to clean the internal environment of the carrier.

In some aspects of the aforementioned embodiments, the wafer transport system is constituted by multiple isolated environments, and the wafers are delivered therebetween. A wafer transport system comprising multiple separated environments comes with several advantages. For example, as a worker walking into the room to repair or replace a semiconductor apparatus, the operation of the wafer transport system may continue operating without contaminating the wafers because the wafers are remained in independent and enclosed environments. Similarly, since the transport system is constituted by multiple independent environments, the wafer transport system may easily skip some semiconductor apparatuses based on the requirements and system configurations. Unlike the conventional transport system, the carrier transports a single wafer immediately after it has been processed in some embodiments of the present invention; therefore, the fabrication time of a wafer may be largely shortened and the yield rate of a wafer may be improved.

Some embodiments of the present invention relates to a method for operating a wafer transport system. In the wafer transport system, a wafer may be transported along a track via a carrier. While the carrier moves along the track, a positioning device identifies the position of the carrier and controls the carrier to stop at a first location. The first location may be near to the opening of a semiconductor apparatus. Once the movement of the carrier has been stopped, a transfer device may be activated to transfer the wafer from the carrier to the semiconductor apparatus. After the wafer is processed, the transfer device is activated to transfer the wafer from the semiconductor apparatus back to the carrier. To clean the carrier which has once been opened, a pipe of a cleaning device may connect to a first air valve of the carrier for cleaning the internal environment of the carrier. Finally, the pipe disconnects from the first air valve if the cleaning process is over and the cleaned carrier transports the wafer along the track to a second location.

In some aspects of the aforementioned embodiments, the carrier is aligned with the opening of the semiconductor apparatus. Therefore, the transfer device may simply transfer the wafer without additional movements such as lifting and rotation. The reduction of unnecessary movements may shorten the fabrication time of a wafer and prevent the wafer from possible collisions. In some other aspects, the low-capacity carrier used in this method further reduces the possibility that the stacking wafers are crushed due to their own weight.

The wafer transport system in the present invention provides an improved performance as to the conventional systems. More particularly, some embodiments of the present invention relate to a wafer transport system comprising multiple clean and isolated environments for the wafers to be transferred therebetween. The embodiments of the present invention provide advantages for improving the yield rate of a wafer, shortening the fabrication time of a wafer, and offering the flexibility and the extendibility to the wafer transport system. Moreover, the present invention also provides a cleaning device to maintain the cleanliness of the internal environment of the wafer transport system immediately.

BRIEF DESCRIPTION OF THE DRAWINGS

FIG. 1 is a schematic diagram illustrating an exemplary wafer transport system in accordance with at least one embodiment of the present invention.

DESCRIPTION OF THE PREFERRED EMBODIMENTS

Figure 2A:
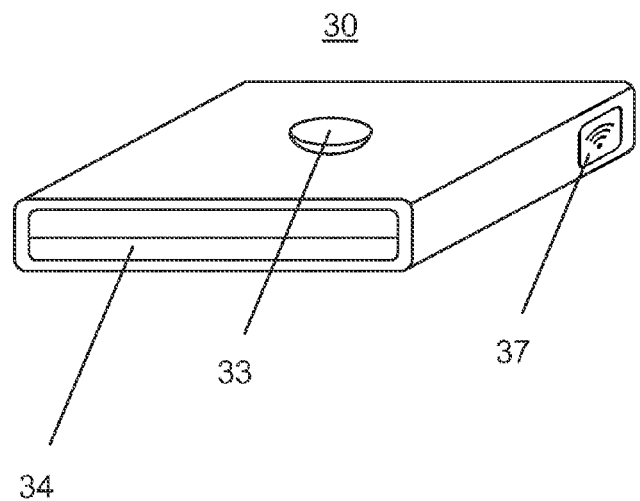
FIG. 2A is a top perspective view of an exemplary carrier in accordance with at least one embodiment of the present invention.

In a general aspect, at least one embodiment in accordance with the present invention relates to a wafer transport system and a method for operating the same. More particularly, at least one embodiment relates to a wafer transport system with a low-capacity carrier and a method for operating the same. The embodiments and drawings provided here show different aspects of the present invention. However, the present invention is neither limited to any embodiment nor drawing thereof.

FIG. 1 is a schematic diagram illustrating an exemplary wafer transport system in accordance with at least one embodiment of the present invention. In FIG. 1, a wafer transport system may comprise at least one semiconductor apparatus 10, an entry port 11, an exit port 12, a track 20, a carrier 30, at least one positioning device 50, at least three transfer devices 60, and a cleaning device 70. The track 20 is located along the at least one semiconductor apparatus 10, the entry port 11, and the exit port 12. The carrier 30 is riding on the track 20 and is for housing and transporting the wafer 40 along the track 20. The positioning device 50 is connected to the track 20 for identifying and controlling the position of the carrier 30 on the track 20. The at least three transfer devices 60 are located between the at least one semiconductor apparatus 10 and the track 20, the entry port 11 and the track 20, and the exit port 12 and the track 20, respectively. The at least three transfer devices 60 are configured for transferring the wafer 40 between the at least one semiconductor apparatus 10, the entry port 11, and the exit port 12. The cleaning device 70 may comprise a pipe 71 and a pump 72. The pipe 71 connects the pump 72 to a first air valve 31 of the carrier 20 to clean the internal environment of the carrier 30.

Figure 2B:
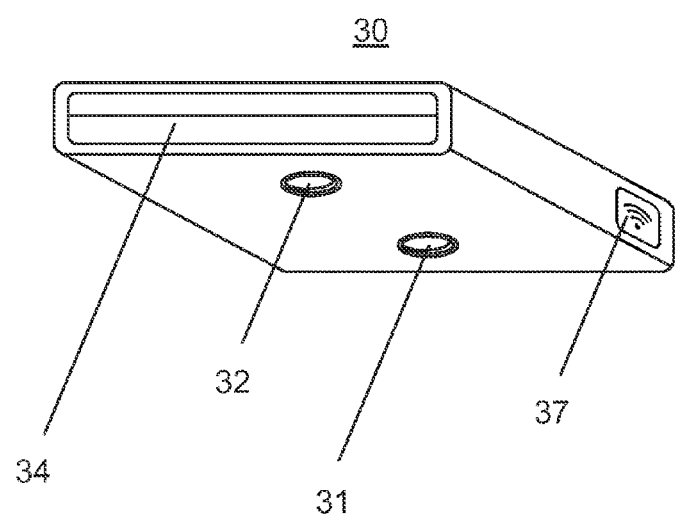
FIG. 2B is a bottom perspective view of an exemplary carrier in accordance with at least one embodiment of the present invention.

FIGS. 2A-2B are the top perspective view and the bottom perspective view of a carrier 30 in accordance with at least one embodiment of the present invention. In some aspects of the aforementioned embodiments, the capacity of the carrier 30 is less than ten wafers. In some other aspects, the carrier 30 carries only one wafer 40 at a time. The internal environment of the carrier 30 may be a vacuum or be filled with clean gas.

The carrier 30 may comprise a first air valve 31, a carrier connector 33, a carrier door 34, and a carrier sensor 37. The first air valve 31 is configured to connect with a pipe 71 of a cleaning device 40 for cleaning the internal environment of the carrier 30. The carrier connector 33 is configured for mounting the carrier 30 to the track 20. Moreover, the carrier connector 33 may be deposited on different sides of the carrier 30 in accordance with the type of track 20 used in the wafer transport system. For example, the carrier connector 33 may be an overhead hoist and is deposited on the top surface of the carrier 30. The carrier door 34 is configured for the wafer 40 to enter or exit the carrier 30. The carrier sensor 37 may be a wafer sensor for detecting the amount of wafers 40 inside the carrier 30, or a RFID sensor capable of cooperating with a positioning device 50 in the wafer transport system. In some embodiments of FIGS. 2A-2B, the carrier 30 further comprises a second air valve 32 configured for expelling the excessive gas.

Figure 3A:
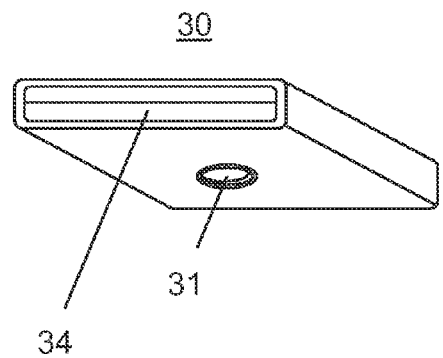
FIG. 3A is a schematic diagram illustrating an exemplary side-open carrier in accordance with at least one embodiment of the present invention.
Figure 3B:
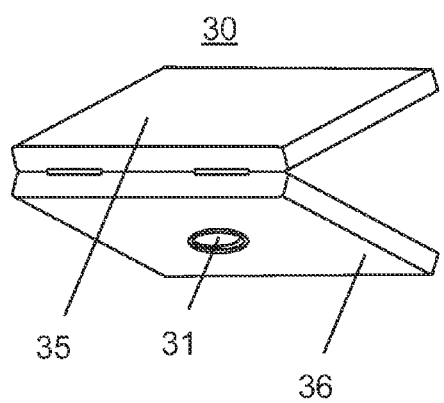
FIG. 3B is a schematic diagram illustrating an exemplary hinged carrier in accordance with at least one embodiment of the present invention.
Figure 3C:
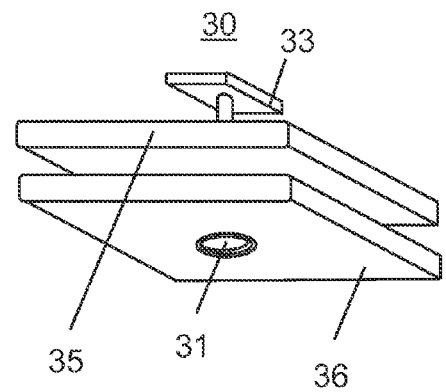
FIG. 3C is a schematic diagram illustrating an exemplary two-piece carrier in accordance with at least one embodiment of the present invention.

FIGS. 3A-3C are schematic diagrams of the exemplary carriers in accordance with some embodiments of the present invention. FIG. 3A illustrates a side-opening carrier which is similar to a conventional FOUP defined in SEMI E47.1 but further characterized by a first air valve 31, a smaller volume, and a reduced capacity. FIG. 3B illustrates a hinged carrier which may comprise a carrier cover 35, a carrier base 36, and a first air valve 31. The carrier cover 35 is attached to the carrier base 36 at one side to form a movable joint which provides the hinged carrier the ability to be opened and closed in a way similar to a book. In some embodiments of FIG. 3B, the hinged carrier further comprises an actuator for driving the hinged carrier to open or close. FIG. 3C illustrates a two-piece carrier which may comprise a carrier cover 35, a carrier base 36, a carrier connector 33, and a first air valve 31. The carrier cover 35 and the carrier base 36 are separated components and each connects to another indirectly. In some embodiments of FIG. 3C, the two-piece carrier is placed onto a track 20 in a wafer transport system. In the aforementioned embodiments, the wafer transport system transports the two-piece carrier by moving the track and opens the two-piece carrier by lifting the carrier cover 35 through the carrier connector 33.

Figure 4:
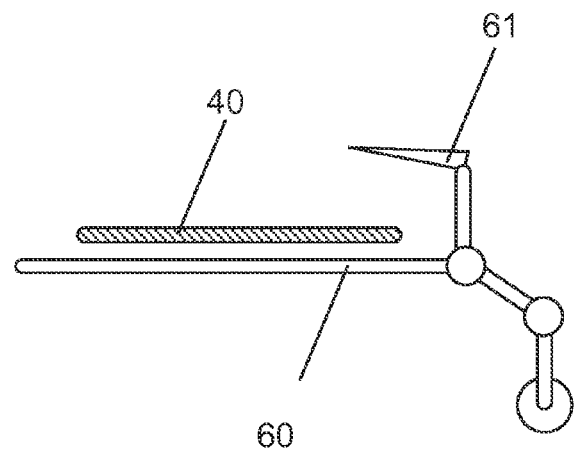
FIG. 4 is a schematic diagram illustrating an exemplary transfer device in accordance with at least one embodiment of the present invention.

FIG. 4 is a schematic diagram illustrating an exemplary transfer device in accordance with at least one embodiment of the present invention. The transfer device 60 in FIG. 4 may be a robot arm and is configured between a track 20 and a semiconductor apparatus 10. In some aspects, the wafer 40 may be temporarily exposed to the environmental contaminants and atmospheric gases when moving between the carrier and the semiconductor apparatus. Accordingly, a nozzle 61 may be configured onto the transfer device 60 for purging the wafer 40 with clean gas which forms a protective layer on the wafer 40 to protect the wafer 40 from the environmental contaminants.

Figure 5:
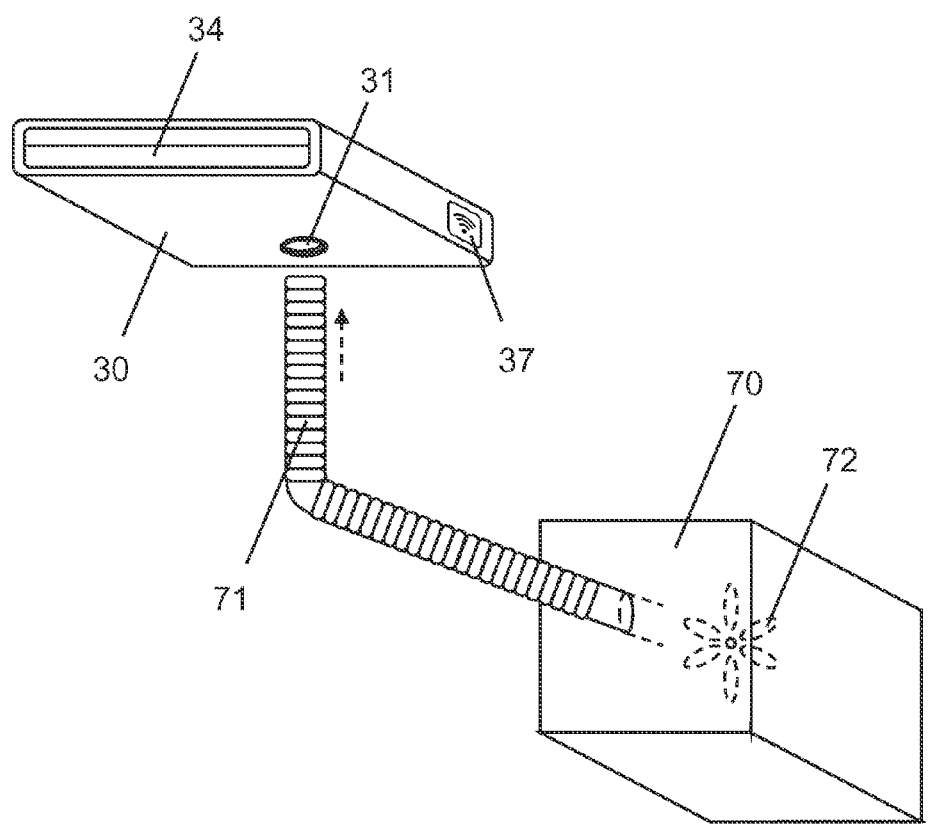
FIG. 5 is a schematic diagram illustrating an exemplary cleaning device in accordance with at least one embodiment of the present invention.

FIG. 5 is a schematic diagram illustrating an exemplary cleaning device in accordance with at least one embodiment of the present invention. FIG. 5 shows a cleaning device 70 comprising a pipe 71 and a pump 72 for cleaning the internal environment of carrier 30. The pipe 71 connects the pump 72 to a first air valve 31 of a carrier 30. In some embodiments of FIG. 5, the pipe 71 is fixedly connected to the first air valve 31 and moves with the carrier 30 in a wafer transport system. In the aforementioned embodiments, the pump 72 is activated to clean the internal environment of the carrier 30 based on the requests for cleaning, and is inactivated when the cleaning process is completed. In some other embodiments of FIG. 5, the pipe 71 is fixedly connected to the first air valve 31 and moves with the carrier 30 in a wafer transport system. In the aforementioned embodiments, the pump 72 cleans the internal environment of the carrier 30 continuously during the movement of the carrier 30. In yet some other embodiments of FIG. 5, the pipe 71 is removably connected to the first air valve 31 of the carrier 70. In the aforementioned embodiments, the pipe 71 temporarily connects to the first air valve 31 when the cleaning device 70 is activated to clean the internal environment of the carrier 30, and disconnects from the first air valve 71 when the cleaning process is completed.

In an alternate embodiment of FIG. 5, a wafer transport system comprises a track 20, a carrier 30, an entry port 11, a first semiconductor apparatus, a second semiconductor apparatus, an exit port 12, and a cleaning device 70. The cleaning device 70 further comprises a first pipe, a second pipe, a third pipe, and a fourth pipe. The first pipe extends to the entry port 11; the second pipe extends to the first semiconductor apparatus; the third pipe extends to the second semiconductor apparatus; and the fourth pipe extends to the exit port 12. In this embodiment, a wafer 40 may be fed to the wafer transport system via the entry port 11. The wafer 40 is then transferred from the entry port 11 to the carrier 30 riding on the track 20, and the first pipe simultaneously connects to a first valve 31 of the carrier 30 to clean the internal environment of the carrier 30. In the next stage, the wafer 40 is transferred from the first semiconductor apparatus back to the carrier 30 once the first process is completed, and the second pipe simultaneously connects to the first valve 31 to clean the internal environment of the carrier 30. In the third stage, the wafer 40 is transferred from the second semiconductor apparatus back to the carrier 30 once the second process is completed, and the third pipe simultaneously connects to the first valve 31 to clean the internal environment of the carrier 30. In the final stage, the wafer 40 exits the wafer transport system via the exit port 12, and the fourth pipe connects to the first valve 31 to clean the internal environment of the carrier 30.

A risk arouse that the carrier 30 opened for receiving the wafer 40 from the semiconductor apparatus 10 may temporarily be exposed to the environmental contaminants. In some embodiments of FIG. 5, the cleaning device 70 cleans the internal environment of a carrier 30 by vacuuming the contaminated air inside the carrier 30. In some other embodiments of FIG. 5, the cleaning device 70 cleans the internal environment of a carrier 30 by filling the carrier 30 with clean gas and simultaneously expelling the contaminated air from the carrier 30 through a second air valve 32 of the carrier 30.

Figure 6:
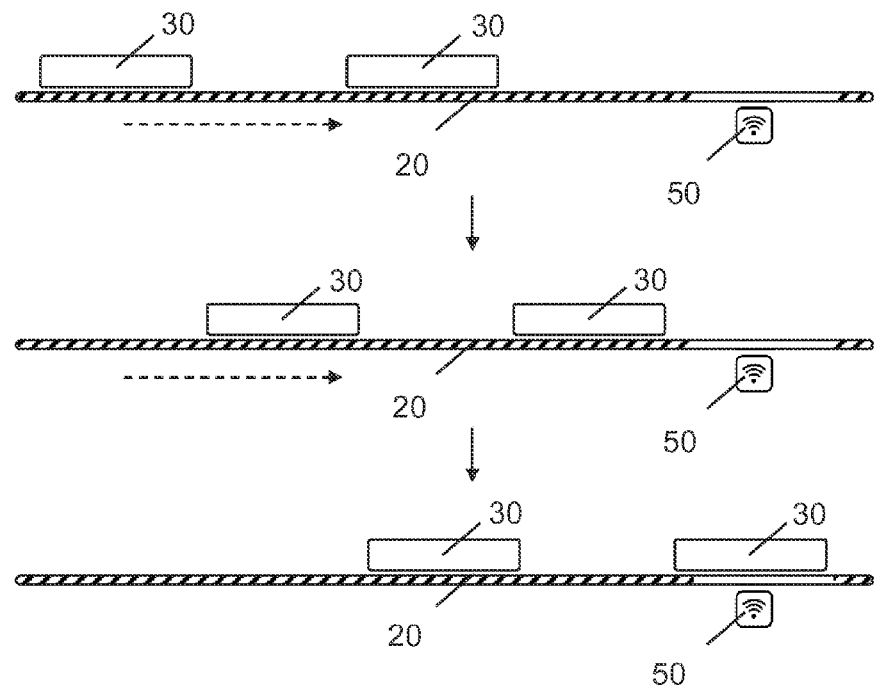
FIG. 6 is a schematic diagram illustrating an exemplary sensor positioning controller in accordance with at least one embodiment of the present invention.

FIG. 6 is a schematic diagram illustrating an exemplary positioning device in accordance with at least one embodiment of the present invention. The positioning device 50 may be a sensor positioning controller, and multiple sensor positioning controllers may coexist in a wafer transport system to form a sensor array to increase the identification accuracy. In some embodiments of FIG. 6, the sensor positioning controller is an optical sensor connected with a track 20 for identifying the location of a carrier 30 on the track 20. The optical sensor may temporarily stop the movement of the track 20 based on an event that the carrier 30 is identified at a first location by the optical sensor. In some other embodiments of FIG. 6, the sensor positioning controller is a RFID sensor connected with a track 20 for identifying the location of a carrier. In the aforementioned embodiments, the carrier 30 may further comprise a RFID chip for assisting the identification processes of the sensor positioning controller.

Figure 7:
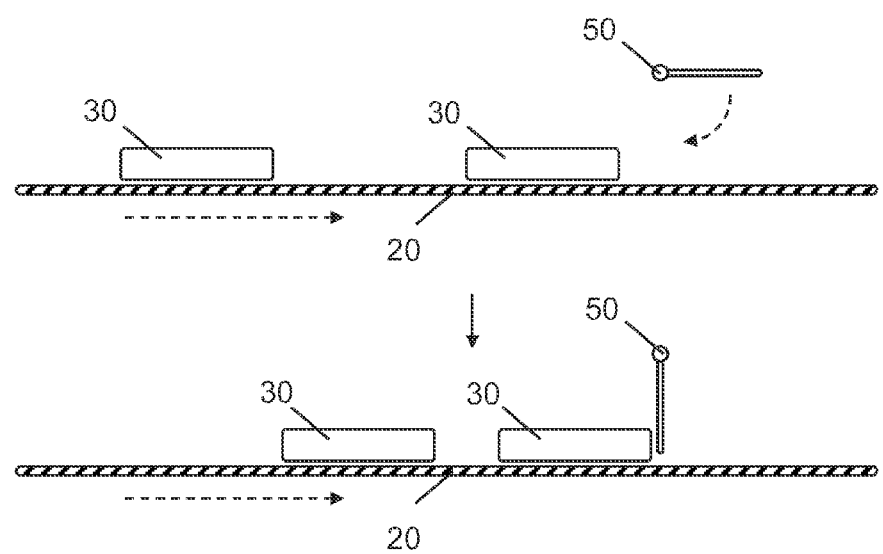
FIG. 7 is a schematic diagram illustrating an exemplary mechanical positioning controller in accordance with at least one embodiment of the present invention.

FIG. 7 is a schematic diagram illustrating an exemplary positioning device in accordance with at least one embodiment of the present invention. The positioning device 50 may be a mechanical positioning controller, and multiple mechanical positioning controllers may coexist in a wafer transport system to increase the flexibility. In some embodiments of FIG. 7, the mechanical positioning controller is a retractable barrier configured on a track 20 for stopping the movement of a carrier 30 at a first location. To control the position of the carrier 30, the retractable barrier is activated and temperately extends across the moving path of the carrier 30 to stop the carrier 30 from moving. In some other embodiments of FIG. 7, the mechanical positioning controller is a movable recess on a track 20 for stopping the movement of a carrier 30 at the first location. As part of the track 20, the movable recess is activated to control the position of the carrier 30 by forming a recess on the track 20 which stops the carrier 30 from moving with the track 20, and is inactivated to release the carrier 30 by removing the recess.

Figure 8:
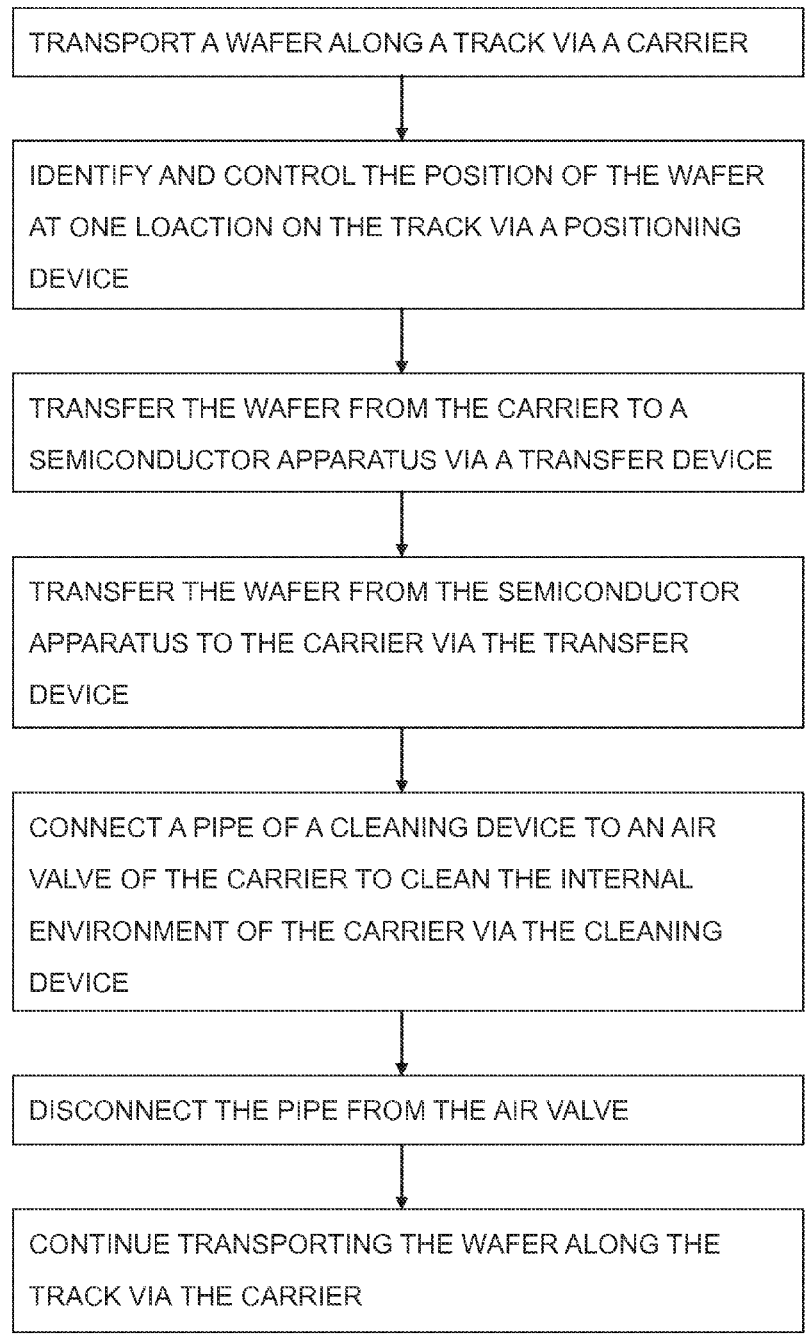
FIG. 8 is a flow diagram illustrating a method for operating a wafer transport system in accordance with at least one embodiment of the present invention.

FIG. 8 is a flow diagram illustrating a method for operating a wafer transport system in accordance with at least one embodiment of the present invention. In the wafer transport system, a wafer 40 may be transported along a track 20 via a carrier 30. While the carrier 30 moves, a positioning device 50 identifies the position of the carrier 30 and controls the carrier 30 to stop at a first location. The first location may be near to the opening of a semiconductor apparatus 10. Once the movement of the carrier 30 has been stopped, a transfer device 60 may be activated to transfer the wafer 40 from the carrier 30 to the semiconductor apparatus 10. After the wafer 40 is processed, the transfer device 60 is activated to transfer the wafer 40 from the semiconductor apparatus 10 back to the carrier 30. To clean the carrier 30 which has once been opened, a pipe 71 of a cleaning device 70 may subsequently connect to a first air valve 31 of the carrier 30 for cleaning the internal environment of the carrier 30. Finally, the pipe 71 disconnects from the first air valve 31 once the cleaning process is completed; and, the carrier 30 further transports the wafer 40 along the track 20 to a second location.

In some embodiments of FIG. 8, a nozzle 61 may be configured on the transfer device 60 for purging the wafer 40 with clean gas to protect the wafer 40 from the contaminants. In some embodiments of FIG. 8, there is a risk that the carrier 30 opened for receiving the wafer 40 from the semiconductor apparatus 10 may be temporarily exposed to the environmental contaminants. Therefore, the cleaning device 70 may clean the internal environment of a carrier 30 by vacuuming the contaminated air inside the carrier 30, or by filling the carrier 30 with clean gas and simultaneously expelling the contaminated air from the carrier 30 through the second air valve 32 of the carrier 30. In some other embodiments of FIG. 8, the positioning device 50 may be a sensor positioning controller or a mechanical positioning controller. The sensor positioning controller stops the movement of the track 20 based on that the carrier 30 is identified at the first location. The mechanical positioning controller is located at the first position on the moving path of the carrier 30 and blocks the movement of the carrier 30 at the first location when the mechanical positioning controller is activated.

In an alternate embodiment of FIG. 8, the wafer transport system comprises several carriers 30 and the method for operating is therefore modified. In the wafer transport system, a wafer 40 may be transported along a track 20 via a first carrier. While the first carrier is moving, a positioning device 50 identifies the position of the first carrier and controls the first carrier to stop at a first location. The first location may be near to the opening of a semiconductor apparatus 10. Once the movement of the first carrier has been stopped, a transfer device 60 may be activated to transfer the wafer 40 from the first carrier to the semiconductor apparatus 10. After the wafer 40 is processed, the transfer device 60 is activated to transfer the wafer 40 from the semiconductor apparatus 10 to a second carrier. A pipe 71 of a cleaning device 70 may connect to a first air valve 31 of the second carrier and a pump 72 of the cleaning device 70 is activated to clean the internal environment of the second carrier which has once been opened. Finally, the pipe 71 disconnects from the first air valve 31 when the cleaning process is completed and the second carrier further transports the wafer 40 to a second location.

Figure 9:
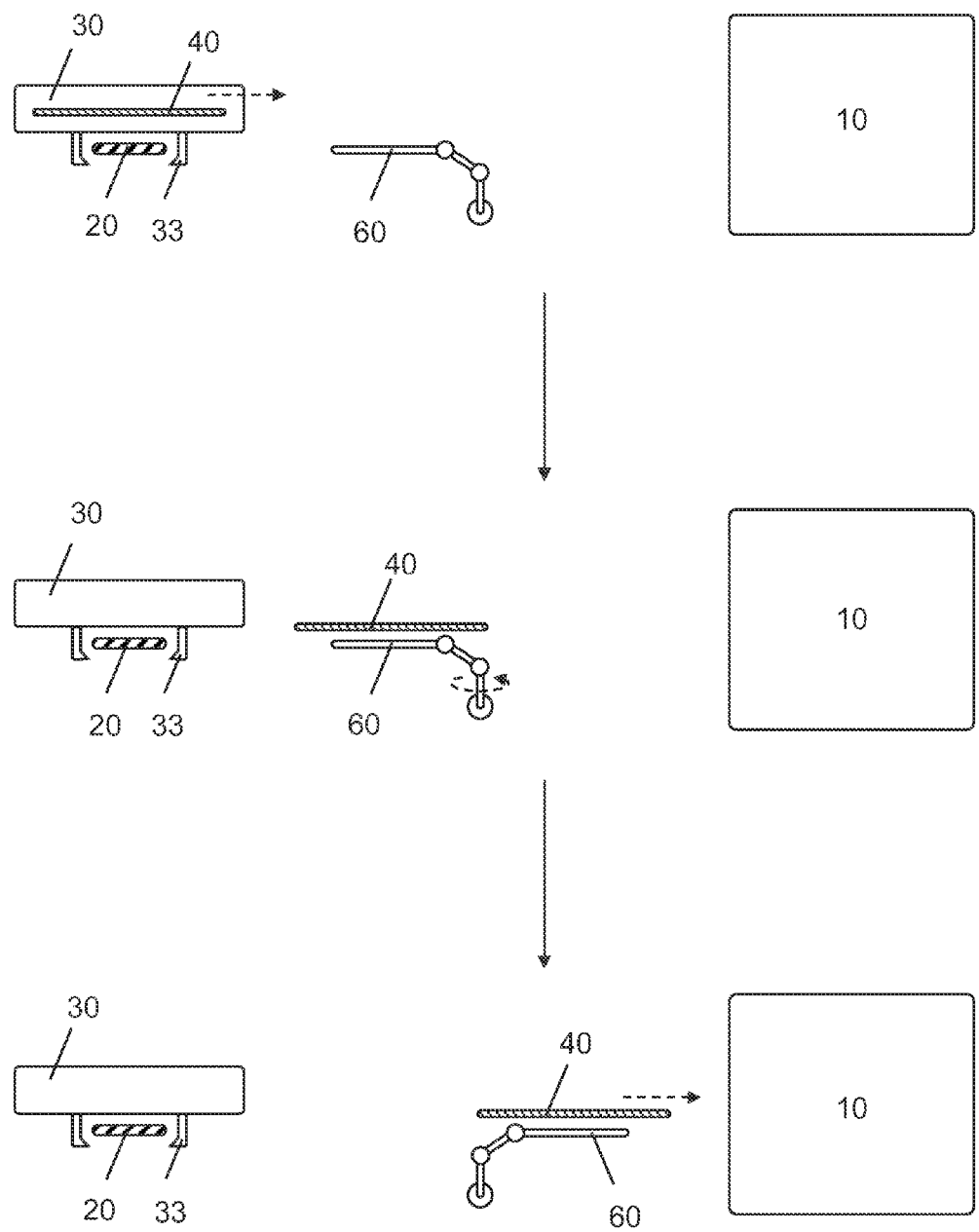
FIG. 9 is a flow diagram illustrating a method for operating a transfer device in accordance with at least one embodiment of the present invention.

FIG. 9 is a schematic diagram illustrating a method for operating a transfer device in accordance with at least one embodiment of the present invention. A positioning device 50 controls a carrier 30 to stop when the positioning device 50 identifies that the carrier 30 is located at a first location and aligned with the opening of the semiconductor apparatus 10. At the same time, a transfer device 60 may be activated to transfer a wafer 40 from the carrier 30 to a semiconductor apparatus 10 to process the wafer 40. Then, the transfer device 60 is activated again to transfer the wafer 40 from the semiconductor apparatus 10 to carrier 30 once the process is completed. In some embodiments, the transfer device 60 moves horizontally. Therefore, the transfer device may simply transfer the wafer without unnecessary movements such as lifting and rotation. The reduction of unnecessary movements may shorten the production cycle of a wafer and prevent the wafer from possible collisions.

Figure 10:
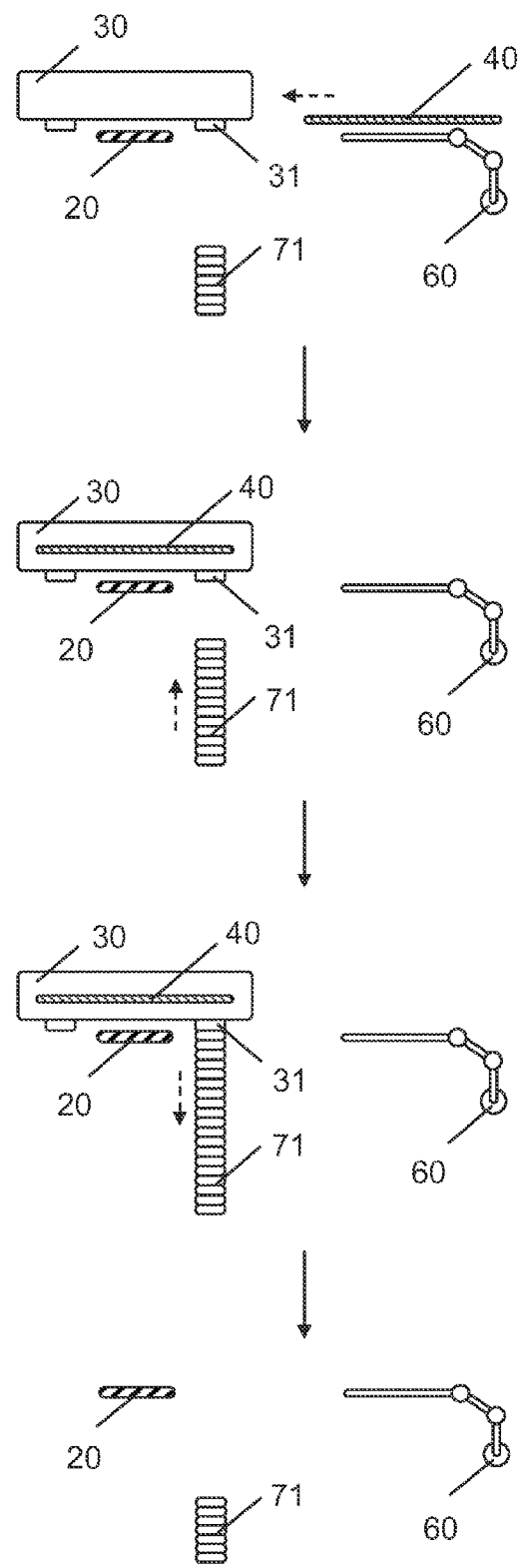
FIG. 10 is a flow diagram illustrating a method for operating a cleaning device in accordance with at least one embodiment of the present invention.

FIG. 10 is a schematic diagram illustrating a method for operating a cleaning device in accordance with at least one embodiment of the present invention. A pipe 71 of a cleaning device 70 may extend and connect to a first air valve 31 of a carrier 30 when the transfer device 60 transferred a wafer 40 from a semiconductor apparatus 10 to the carrier 30. Subsequently, a pump 72 of the cleaning device 70 is activated to clean the internal environment of the carrier 30. Once the cleaning process is completed, the pipe 71 disconnects from the first air valve 31 and the carrier 30 then transports the wafer 40 away to a second location along the track 20

The figures and descriptions supra set forth only illustrated the preferred embodiments of the instant disclosure; however, the characteristics of the instant disclosure are by no means restricted thereto. All changes, alternations, combinations or modifications easily considered by the people skilled in the art are deemed to be encompassed within the scope of the instant disclosure delineated by the following claims.

What is claimed is:

1. A wafer transport system, comprising:
   a semiconductor apparatus;
   a track, located along the semiconductor apparatus;
   a carrier, riding on the track, for housing a wafer and transporting the wafer along the track, wherein the carrier comprises a first air valve;
   a positioning device, connected to the track, for identifying and controlling the position of the carrier on the track;
   a transfer device, located between the semiconductor apparatus and the track, for transferring the wafer between the semiconductor apparatus and the track; and
   a cleaning device, comprising a pipe and a pump, for cleaning the internal environment of the carrier, wherein the pipe is configured to provide a connection between the pump and the first air valve.

2. The wafer transport system as claimed in claim 1, wherein the carrier is a side-opening carrier, a hinged carrier, or a two-piece carrier.

3. The wafer transport system as claimed in claim 1, wherein the carrier comprises a second air valve.

4. The wafer transport system as claimed in claim 1, wherein the positioning device is a sensor positioning controller or a mechanical positioning controller.

5. The wafer transport system as claimed in claim 1, wherein the transfer device is a robot arm.

6. The wafer transport system as claimed in claim 1, wherein the transfer device comprises a nozzle for purging the wafer with gas.

7. The wafer transport system as claimed in claim 1, wherein the connection between the pipe and the first valve is fixed or removable.

8. A wafer transport system, comprising:
   at least one semiconductor apparatus;
   an entry port;
   an exit port;
   a track, located along the at least one semiconductor apparatus, the entry port, and the exit port;
   a carrier, riding on the track, for housing a wafer and transporting the wafer along the track, wherein the carrier comprises a first air valve;
   at least one positioning device, connected to the track, for identifying and controlling the position of the carrier on the track;
   at least three transfer devices, located between the at least one semiconductor apparatus and the track, the entry port and the track, and the exit port and the track respectively, wherein the at least three transfer devices are configured for transferring the wafer between the at least one semiconductor apparatus, the track, the entry port and the exit port; and
   a cleaning device, comprising a pipe and a pump, for cleaning the internal environment of the carrier, wherein the pipe is configured to provide a connection between the pump and the first air valve.

9. The wafer transport system as claimed in claim 8, wherein the carrier is a side-opening carrier, a hinged carrier, or a two-piece carrier.

10. The wafer transport system as claimed in claim 8, wherein the carrier comprises a second air valve.

11. The wafer transport system as claimed in claim 8, wherein the at least one positioning device is a sensor positioning controller or a mechanical positioning controller.

12. The wafer transport system as claimed in claim 8, wherein one of the at least three transfer devices is a robot arm.

13. The wafer transport system as claimed in claim 8, wherein one of the at least three transfer devices comprises a nozzle for purging the wafer with gas.

14. The wafer transport system as claimed in claim 8, wherein the connection between the pipe and the first valve is fixed or removable.

* * * * *